(12) United States Patent
Kim et al.

(10) Patent No.: US 8,471,232 B2
(45) Date of Patent: Jun. 25, 2013

(54) RESISTIVE MEMORY DEVICES INCLUDING VERTICAL TRANSISTOR ARRAYS AND RELATED FABRICATION METHODS

(75) Inventors: Deok-kee Kim, Seoul (KR); In Kyeong Yoo, Yongin-si (KR); Kyoung-won Na, Seoul (KR); Kwnag-Soo Seol, Yongin-si (KR); Dong-Seok Suh, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 618 days.

(21) Appl. No.: 12/724,498

(22) Filed: Mar. 16, 2010

(65) Prior Publication Data

US 2011/0068409 A1 Mar. 24, 2011

(30) Foreign Application Priority Data

Sep. 22, 2009 (KR) .................. 10-2009-0089647

(51) Int. Cl.
*H01L 47/00* (2006.01)
(52) U.S. Cl.
USPC ........... 257/2; 257/3; 257/4; 257/67; 365/163

(58) Field of Classification Search
USPC ...................... 257/2–4, 67; 365/163
See application file for complete search history.

(56) References Cited

U.S. PATENT DOCUMENTS

| 6,740,921 B2 | 5/2004 | Matsuoka et al. |
| 2003/0017710 A1 | 1/2003 | Yang et al. |
| 2007/0034921 A1 | 2/2007 | Daley et al. |

FOREIGN PATENT DOCUMENTS

KR    1020050091902 A    9/2005

*Primary Examiner* — Samuel Gebremariam
(74) *Attorney, Agent, or Firm* — Myers Bigel Sibley & Sajovec, P.A.

(57) ABSTRACT

A resistive memory device includes a vertical transistor and a variable resistance layer. The vertical transistor includes a gate electrode on a surface of a substrate, a gate insulation layer extending along a sidewall of the gate electrode, and a single crystalline silicon layer on the surface of the substrate adjacent to the gate insulation layer. At least a portion of the single crystalline silicon layer defines a channel region that extends in a direction substantially perpendicular to the surface of the substrate. The variable resistance layer is provided on the single crystalline silicon layer. The variable resistance layer is electrically insulated from the gate electrode. Related devices and fabrication methods are also discussed.

20 Claims, 17 Drawing Sheets

RESISTIVE MEMORY DEVICES INCLUDING VERTICAL TRANSISTOR ARRAYS AND RELATED FABRICATION METHODS

CROSS-REFERENCE TO RELATED APPLICATIONS

This application claims priority from Korean Patent Application No. 10-2009-0089647, filed on Sep. 22, 2009, in the Korean Intellectual Property Office, the disclosure of which is incorporated by reference herein in its entirety.

BACKGROUND

The inventive concept relates to memory devices, and more particularly, to resistive memory devices.

Memory devices may be classified as volatile memory devices that require a refresh operation to retain data stored when power is not supplied, and non-volatile memory devices that do not require a refresh operation to retain data when power is not supplied. Thus, power consumption may be reduced in non-volatile memory devices.

Examples of non-volatile memory devices may include flash memory devices, ferroelectric memory devices, phase change memory devices, resistive memory devices, etc. In particular, resistive memory devices, such as resistive random access memory (RRAM), may offer relatively high speed, high capacity, and low power consumption characteristics.

SUMMARY

Embodiments of the inventive concept provide a resistive memory device that uses resistance change characteristics of a resistance change material.

According to some embodiments of the inventive concept, a memory cell of a resistive memory device includes a vertical transistor and a variable resistance layer. The vertical transistor includes a gate electrode on a surface of a substrate, a gate insulation layer extending along a sidewall of the gate electrode, and a single crystalline silicon layer on the surface of the substrate adjacent to the gate insulation layer. At least a portion of the single crystalline silicon layer defines a channel region that extends in a direction substantially perpendicular to the surface of the substrate. The variable resistance layer is provided on the single crystalline silicon layer. The variable resistance layer is electrically insulated from the gate electrode.

In some embodiments, the single crystalline silicon layer may include a plurality of epitaxial layers of alternating conductivity types. For example, in some embodiments, the plurality of epitaxial layers may include an n-type epitaxial layer, a p-type epitaxial layer, and an n-type epitaxial layer that are sequentially stacked on the substrate. In other embodiments, the plurality of epitaxial layers may include an n-type epitaxial layer and a p-type epitaxial layer that are sequentially stacked on the substrate.

In some embodiments, the resistive memory device may further include a bit line on the variable resistance layer. The variable resistance layer may be electrically coupled between the bit line and a source/drain region in the single crystalline silicon layer.

In some embodiments, the resistive memory device may further include a device isolation layer. The device isolation layer may include a first portion on the surface of the substrate and extending along a sidewall of the gate electrode opposite the gate insulation layer, and a second portion on the gate electrode and on the gate insulation layer. The first portion may extend between the gate electrode and an adjacent resistive memory device on the surface of the substrate, and the second portion may extend between the gate electrode and the variable resistance layer.

In some embodiments, the resistive memory device may further include a device isolation layer on the gate electrode and on the gate insulation layer. The device isolation layer may electrically insulate the gate electrode from the bit line. The device isolation layer may further extend onto a portion of the single crystalline silicon layer in some embodiments.

In some embodiments, the variable resistance layer may extend along a portion of the gate insulation layer and may be confined below the device isolation layer. The resistive memory device may further include a connection electrode on the variable resistance layer and extending through the device isolation layer to electrically connect the variable resistance layer to the bit line in some embodiments.

In some embodiments, the variable resistance layer may be on a portion of the single crystalline silicon layer adjacent to the device isolation layer such that the variable resistance layer and the device isolation layer define a substantially planar surface.

According to further embodiments of the inventive concept, a resistive memory device includes a plurality of word lines extending in a first direction on a surface of a substrate. The plurality of word lines are electrically separated from one another by a device isolation layer in a second direction that is substantially perpendicular to the first direction. Respective gate insulation layers extend along respective sidewalls of the plurality of word lines in the first direction. A single crystalline silicon layer is adjacent to the gate insulation layers and defines at least one channel region that extends in a third direction substantially perpendicular to the surface of the substrate. The word lines, the gate insulation layers, and the single crystalline silicon layer define a vertical transistor array arranged in the first direction and the second direction. A device isolation layer extends in the first direction on the plurality of word lines and on the gate insulation layers. A variable resistance layer is adjacent to the single crystalline silicon layer at a side of the word lines, and is electrically insulated from the plurality of word lines by the device isolation layer. A plurality of bit lines on the variable resistance layer extend in the second direction substantially perpendicular to the plurality of word lines and are separated from one another in the first direction.

In some embodiments, the variable resistance layer may be on the single crystalline silicon layer and may extend in the first direction substantially parallel to the word lines. The variable resistance layer may electrically couple ones of the plurality of bit lines to respective source/drain regions in the single crystalline silicon layer.

In some embodiments, the plurality of bit lines may be directly on the device isolation layer and the variable resistance layer, or may be on a connection electrode on the resistance change layer.

In some embodiments, the device isolation layer may include a first portion on the substrate extending along respective sidewalls of the plurality of word lines opposite the gate insulation layers, and a second portion on the plurality of word lines, the gate insulation layer, and the single crystalline silicon layer.

In some embodiments, the device isolation layer may extend on the plurality word lines, the gate insulation layers, and portions of the single crystalline silicon layer. The variable resistance layer may extend along portions of the respective gate insulation layers and may be confined below the device isolation layer.

According to still further embodiments of the inventive concept, a method of fabricating a resistive memory device includes forming a single crystalline silicon layer comprising alternating layers of different conductivity types on a substrate. A plurality of grooves are formed in the single crystalline silicon layer extending in a first direction, and are separated from one another in a second direction substantially perpendicular to the first direction. A respective gate insulation layer and a respective word line is formed in each of the plurality of grooves extending in the first direction. The word lines, the gate insulation layers, and the single crystalline silicon layer define a vertical transistor array arranged in the first direction and the second direction. A device isolation layer is formed extending in the first direction on the word lines and the gate insulation layers, and a variable resistance layer is formed on portions of the single crystalline silicon layer outside the plurality of grooves. A plurality of bit lines are formed on the resistance change layer and electrically connected thereto. The plurality of bit lines extend in a second direction substantially perpendicular to the word lines, and are separated from one another in the first direction.

In some embodiments, forming the device isolation layer may include etching a portion of the single crystalline silicon layer and a portion of the word line in each of the plurality of grooves to define respective trenches therein. A first portion of the device isolation layer may be formed in the trenches adjacent sidewalls of the word lines, and a second portion of the device isolation layer may be formed on the word lines and the gate insulation layer in the grooves.

In some embodiments, forming the single crystalline layer may include epitaxially growing the alternating layers of different conductivity types.

In some embodiments, the device isolation layer may be formed on the word lines, on the gate insulation layer, and on portions of the single crystalline silicon layer.

In some embodiments, the device isolation layer may be adjacent to the variable resistance layer that is formed on single crystalline silicon layer, and may extend on the word line and the gate insulation layer such that the variable resistance layer and the device isolation layer define a substantially planar surface.

In some embodiments, the variable resistance layer may extend in the first direction on the single crystalline silicon layer at sides of the word lines and the gate insulation layers. The variable resistance layer may electrically couples ones of the plurality of bit lines to respective source/drain regions in the single crystalline silicon layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EMBODIMENTS

Figure 1:
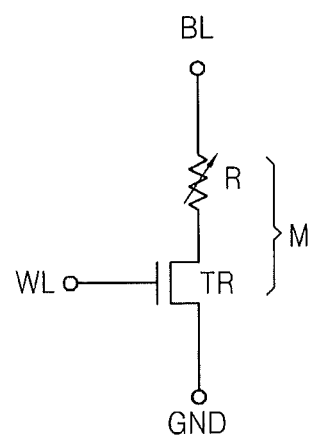
FIG. 1 is a circuit diagram illustrating a memory cell of a resistive memory device according to some embodiments of the inventive concept.

The present inventive concept will now be described more fully hereinafter with reference to the accompanying drawings, in which embodiments of the inventive concept are shown. This inventive concept, however, may be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the thicknesses of layers and regions are exaggerated for clarity. Like numbers refer to like elements throughout. Like elements may also be denoted with different reference numbers in some embodiments described herein.

It will be understood that when an element or layer is referred to as being "cm", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present inventive concept are described herein with reference to cross-section illustrations that are schematic illustrations of idealized embodiments (and intermediate structures) of the inventive concept. As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

According to embodiments of the inventive concept, a memory cell may include a transistor and a variable resistor. The transistor may include a gate electrode that is formed on a semiconductor substrate and functions as a word line, a gate insulation layer formed at a side of the gate electrode, and a channel layer that is formed in a single crystalline silicon layer that is formed on the semiconductor substrate adjacent to the gate insulation layer.

According to embodiments of the inventive concept, a plurality of memory cells are arranged on the semiconductor substrate in an X-direction and a Y-direction, e.g., in the X-Y plane. Accordingly, the transistor of each of the memory cells is implemented as a vertical array transistor. The memory cells are connected to a variable resistor which is connected to a bit line. Such resistive memory devices will be described in greater detail below.

FIG. 1 is a circuit diagram illustrating a memory cell M of a resistive memory device according to some embodiments of the inventive concept.

In detail, the memory cell M includes one transistor TR and one variable resistor R. The variable resistor R is formed of a resistance change layer, also referred to herein as a variable resistance layer or material. The variable resistor R and the resistance change layer R may refer to the same element. The resistance change layer R is formed of a transition metal oxide or a ternary oxide. Examples of the transition metal oxide of the resistance change layer R include $NiO_x$, $ZrO_x$ and $Nb_2O_{5-x}$. Examples of the ternary oxide include chromium (Cr)-doped $SrTiO_3$ and $Pr_{1-x}Ca_xMnO_3$. The resistance change layer R may also be formed of other materials, such as perovskite materials.

The transistor TR includes a gate electrode that functions as a word line WL. A first terminal of the transistor TR, for example, a source, is connected to a ground GND. A second terminal of the transistor TR, for example, a drain, is connected to a first terminal of the variable resistor R. A second terminal of the variable resistor R is connected to a bit line BL. The variable resistor R is thereby connected between the transistor TR and the bit line BL. As described above, the resistive memory device uses the transistor TR, that is, a metal-oxide-semiconductor (MOS) transistor, and thus is capable of using both a unipolar resistance change layer and a bipolar resistance change layer, regardless of the polarity of a voltage applied thereto.

The resistive memory device according to the current embodiment of the inventive concept uses resistance change characteristics of the variable resistor R according to a voltage or a current applied to the memory cell M through the bit line BL. In the resistive memory device according to some embodiments, a set voltage or a current (programming voltage or current) is applied to the variable resistor R through the bit line BL to change the variable resistor R from a high resistance state to a low resistance state and the transistor TR is turned on to create a current path from the bit line BL to the ground GND, thereby programming the memory cell M.

Also, when a reset current (erase current) or a reset voltage (erase voltage) is applied to the variable resistor R through the bit line BL, the variable resistor R is changed from the low resistance state to the high resistance state and no current path is created, and thus the contents of the memory cell M are erased. Also, a state of the memory cell M, that is, whether it is in a programmed state or an erased state is determined by applying a read current or a read voltage to the variable resistor R through the bit line BL and reading the voltage or current in the bit line BL. The resistive memory device including the memory cell M according to some embodiments of the inventive concept will be described in detail below.

EXAMPLE 1

Figure 2:
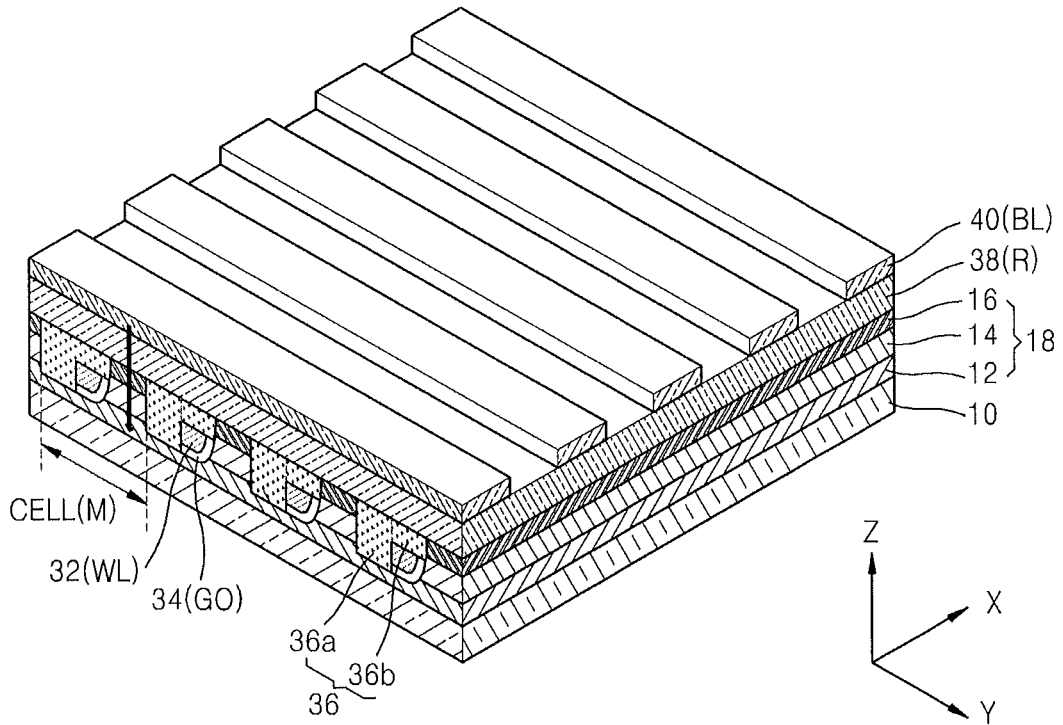
FIGS. 2 and 3 are perspective views illustrating a resistive memory device according to some embodiments of the inventive concept.
Figure 3:
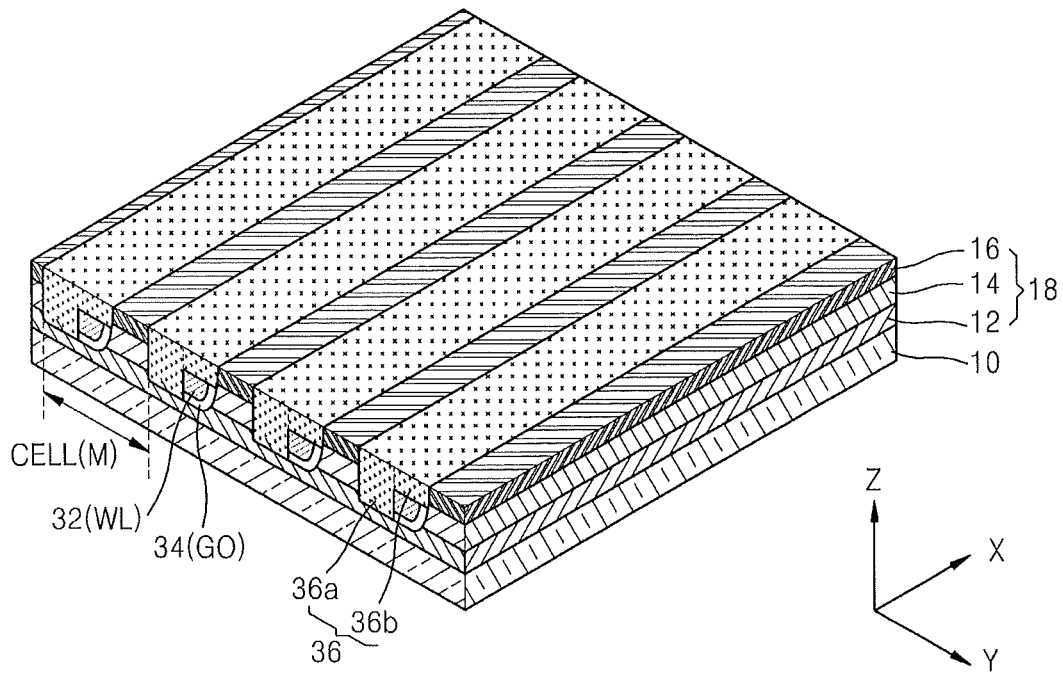
Figure 4:
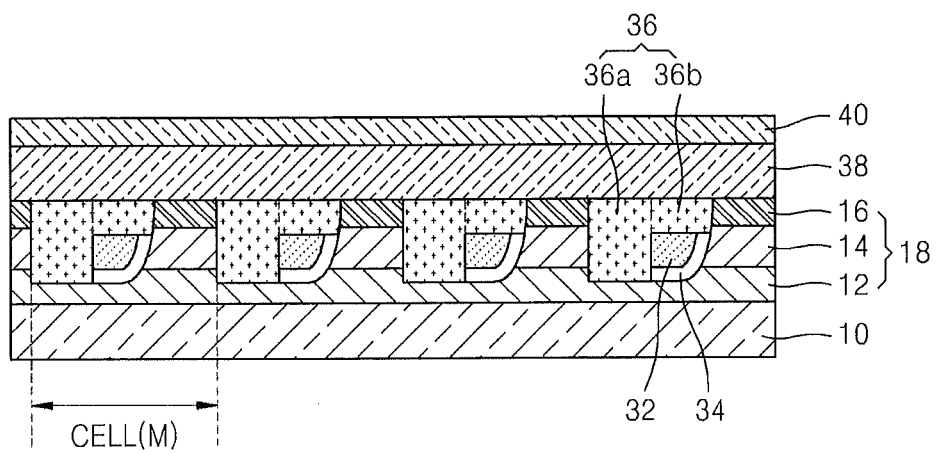
FIGS. 4 and 5 are cross-sectional views illustrating the resistive memory device of FIG. 2.
Figure 5:
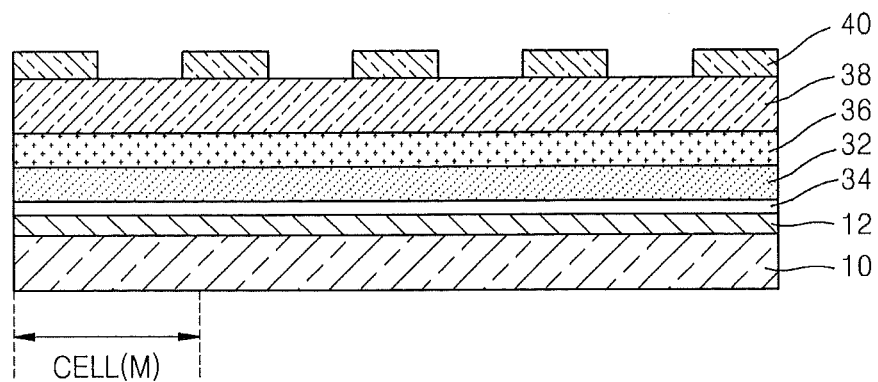

FIGS. 2 and 3 are perspective views illustrating a resistive memory device according to some embodiments of the inventive concept. FIGS. 4 and 5 are cross-sectional views illustrating the resistive memory device of FIG. 2. Referring to FIG. 3, a resistance change layer R 38 and a bit line BL 40 illustrated in FIG. 2 are omitted for convenience.

First, a memory cell M of the resistive memory device illustrated in FIG. 1 will be described with reference to FIGS. 2 through 5.

A gate electrode 32 functioning as a word line WL is formed on a semiconductor substrate 10. The gate electrode 32 may be formed of a polysilicon layer that is doped with impurities. A gate insulation layer 34 is formed on a side portion of the gate electrode 32. The gate insulation layer 34 may be formed of an oxide layer. A single crystalline silicon layer 18 that constitutes a channel layer is formed adjacent to the gate insulation layer 34 and is formed on the semiconductor substrate 10 in a Z-direction (e.g., such that the channel extends in the Z-direction). The gate electrode 32, the gate insulation layer 34, and the single crystalline silicon layer 18 together constitute the transistor TR illustrated in FIG. 1. The transistor TR is a vertical transistor consisting of layers stacked vertically on the semiconductor substrate 10. The resistive memory device uses the single crystalline layer 18 as a channel layer, and thus distribution of device parameters such as a set voltage, a reset voltage, a set current, a reset current, etc. thereof may be reduced compared to when a polysilicon layer is used as the channel layer.

In addition, a resistance change layer R 38 that is insulated from the gate electrode 32 is formed at a side of the gate electrode 32 adjacent to an uppermost single crystalline silicon layer 16 of the single crystalline silicon layer 18. In the resistive memory device according to the current embodiment, the transistor TR including the gate electrode 32, the gate insulation layer 34, and the single crystalline silicon layer 18 constituting a channel layer and the resistance change layer R 38 constitute one memory cell M.

The memory cell M is separated from adjacent memory cells M via a device isolation layer 36. The device isolation layer 36 includes a first device isolation layer 36a and a second device isolation layer 36b. The first device isolation layer 36a is formed on the semiconductor substrate 10 to face the single crystalline silicon layer 18 of an adjacent memory cell and to be adjacent to the gate electrode 32 of the present memory cell M. The second device isolation layer 36b is formed on the gate electrode 32 and the gate insulation layer 34 adjacent to the first device isolation layer 36a.

A bit line BL 40 is formed on the resistance change layer R 38. Due to the device isolation layer 36 including the first device isolation layer 36a and the second device isolation layer 36b, only one direction of the memory cell M may be used when operating the memory cell M. For example, when programming or erasing the memory cell M, only one side of the gate electrode 32 is used. In the resistive memory device according to some embodiments of the inventive concept, a vertical transistor is disposed only at one side of the memory cell M to prevent interference between memory cells.

A voltage or a current is applied to the resistance change layer R 38 through the bit line BL 40 so as to change the resistance change layer R 38 to a low resistance state, and when a voltage is applied to the gate electrode 32, an inversion layer is formed in the single crystalline silicon layer 18, and thus a current flows through the bit line BL 40 in a direction perpendicular to an upper surface of the semiconductor substrate 10, for example, in the bolded arrow direction (e.g. the Z-direction) indicated in FIG. 2, thereby programming the memory cell M. Also, when a voltage or a current is applied to the resistance change layer R 38 through the bit line BL 40 and thus the resistance change layer R 38 is changed to a high resistance state, no current flows in the direction perpendicular to the upper surface of the semiconductor substrate 10, thereby erasing the contents of the memory cell M.

Next, the arrangement of the memory cells M on the substrate 10 (e.g., in an X-direction) and a Y-direction in the resistive memory device according to some embodiments of the inventive concept will be described below with reference to FIGS. 2 through 5.

In detail, a plurality of word lines WL 32 extend in a first direction, for example, in the X-direction, on the semiconductor substrate 10. The word lines WL 32 are electrically separated from each other via the device isolation layer 36 along a second direction that is perpendicular to the first direction, that is, in the Y-direction. The gate insulation layer GO 34 is formed on at least a portion of the word lines WL 32 in the first direction.

A plurality of the single crystalline silicon layers 18 including a channel layer extending or stacked in a third direction perpendicular to an upper surface of the semiconductor substrate 10, that is, in a Z-direction, are formed adjacent to the gate insulation layer 34. The single crystalline silicon layer 18 includes materials having different conductive types. For example, the single crystalline silicon layer 18 includes an n-type epitaxial layer 12, a p-type epitaxial layer 14, and an n-type epitaxial layer 16. Alternatively, the n-type epitaxial layer 16 may be omitted in some embodiment. The n-type epitaxial layer 16 is an uppermost single crystalline layer among the single crystalline silicon layers 18 in the embodiment of FIGS. 2-5, thus, in embodiments where the n-type epitaxial layer 16 is omitted, the p-type epitaxial layer 14 is an uppermost layer. As described above, the word line WL 32, the gate insulation layer 34, and the single crystalline silicon layer 18 constitute one vertical transistor TR. A plurality of such vertical transistors TR are arranged in the first and second directions, thereby forming a vertical transistor array.

The resistance change layer R 38 that is insulated from the word lines WL 32 is formed on the n-type epitaxial layer 16 of the single crystalline silicon layer 18. The device isolation layer 36 is formed on the word lines WL 32 so that the resistance change layer R 38 does not contact the word lines WL 32. Accordingly, a leakage current flow between memory cells M through the word lines WL 32 may be reduced. A plurality of the bit lines BL 40 are formed on the resistance change layer R 38 to extend in the second direction perpendicular to the word lines WL 32, that is, in the Y-direction, and are separated from each other along the first direction. The resistance change layer R 38 is formed of a resistance change material layer whose resistance may change when a voltage or a current is applied thereto through the bit line BL 40 as described above.

As described above, when a voltage or a current is applied to the resistance change layer R 38 through the bit line BL 40, the resistance change layer R 38 is changed to a low resistance or high resistance state, thereby affecting current flow in a vertical direction to the semiconductor substrate 10 to thereby program or erase the memory cell M.

EXAMPLE 2

Figure 6:
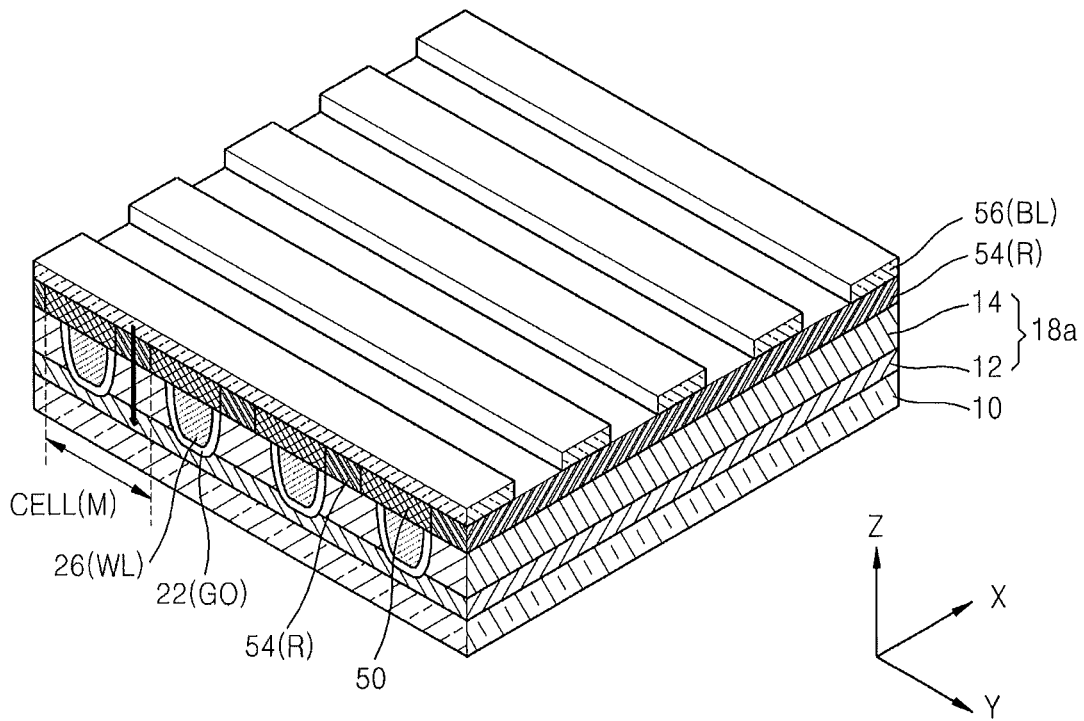
FIGS. 6 and 7 are perspective views illustrating a resistive memory device according to further embodiments of the inventive concept.
Figure 7:
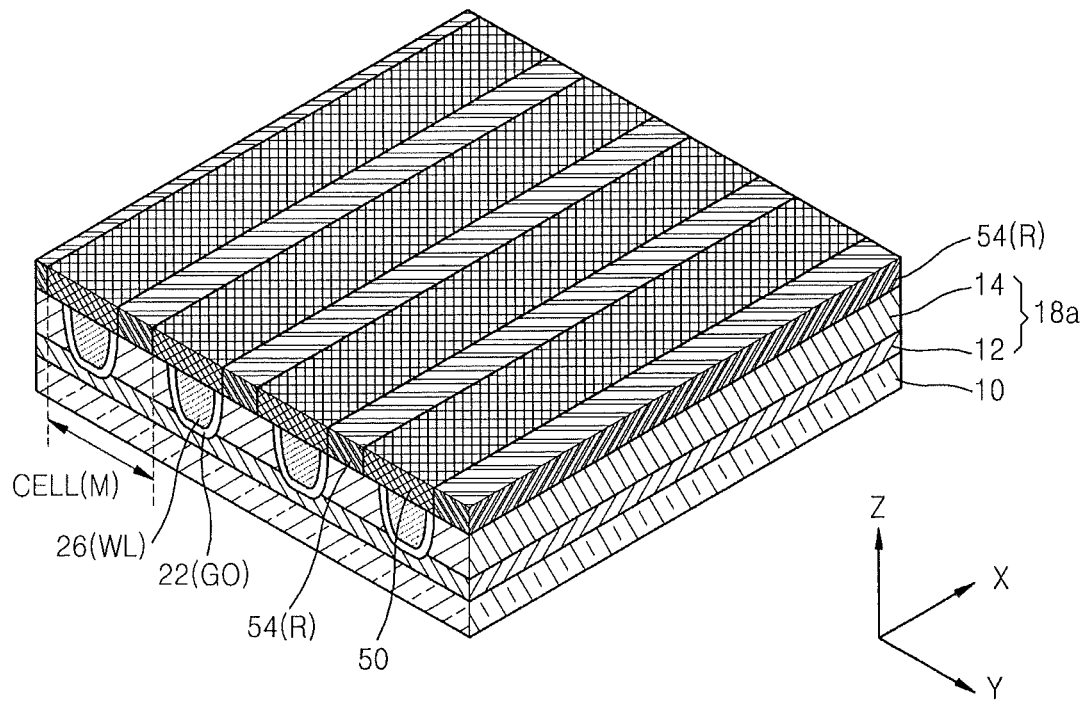
Figure 8:
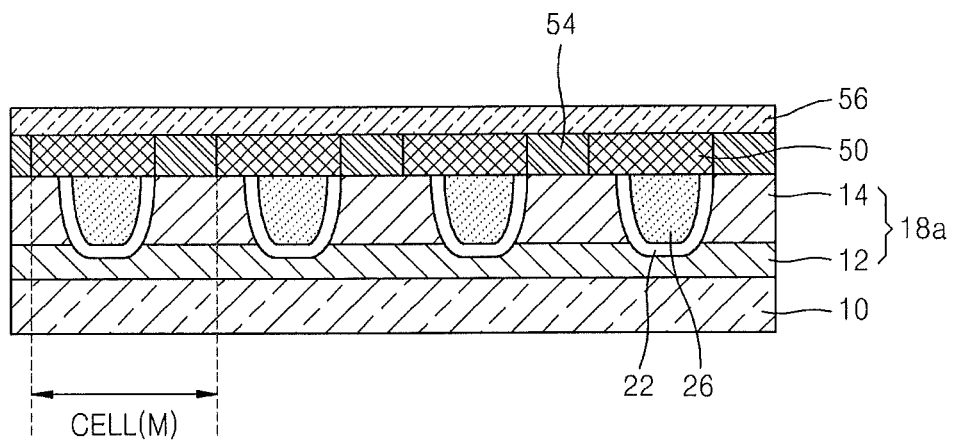
FIGS. 8 and 9 are cross-sectional views illustrating the resistive memory device of FIG. 6.
Figure 9:
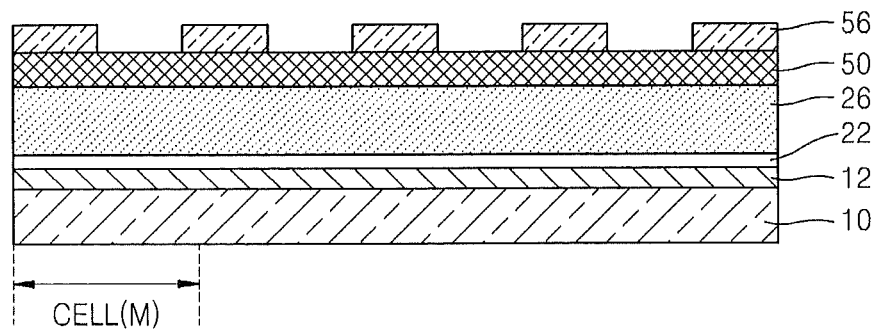

FIGS. 6 and 7 are perspective views illustrating a resistive memory device according to further embodiments of the inventive concept. FIGS. 8 and 9 are cross-sectional views illustrating the resistive memory device of FIG. 6. Referring to FIG. 7, a bit line BL 56 illustrated in FIG. 6 is omitted for convenience.

In detail, the resistive memory device according to further embodiments is similar to that of the previous embodiment, except that a device isolation layer 50 is formed on a gate electrode 26 functioning as a word line WL and a gate insulation layer 22 and on a portion of a single crystalline silicon layer 18a, and a resistance change layer R 54 is formed at a side of the gate electrode 26 within one memory cell M.

In detail, a plurality of the word lines WL 26 are formed on the semiconductor substrate 10 to extend in a first direction, for example, in an X direction. The word lines WL 26 are electrically separated from each other via a device isolation layer 50 along a second direction perpendicular to the first direction, that is, in a Y-direction. The gate insulation layer GO 22 is formed to extend in the first direction on a portion of the word lines WL26 at a side of the word lines WL 26. The gate insulation layer 22 may be formed of an oxide layer.

A plurality of the single crystalline silicon layers 18a constituting a channel layer are formed adjacent to the gate insulation layer 22 and are stacked in a third direction perpendicular to an upper surface of the semiconductor substrate 10, that is, in a Z-direction. The single crystalline silicon layers 18a include an n-type epitaxial layer 12 and a p-type epitaxial layer 14. The p-type epitaxial layer 14 is an uppermost single crystalline silicon layer of the single crystalline silicon layer 18. When the single crystalline silicon layer 18a is formed as the channel layer, distribution of device parameters such as a set voltage, a reset voltage, a set current, a reset current, etc. may be reduced compared to when a polysilicon layer is formed as the channel layer. In the resistive memory device according to the current embodiment, the word line WL 26, the gate insulation layer 22, and the single crystalline silicon layer 18a constitute one vertical transistor TR. A plurality of such vertical transistors TR are arranged in the first and second directions, thereby forming a vertical transistor array.

In the resistive memory device according to the current embodiment, the device isolation layer 50 is formed on the word line WL 26 and the gate insulation layer 22 and on a portion of the single crystalline silicon layer 18a, that is, the p-type epitaxial layer 14. Also, the resistance change layer R 54 is formed on the p-type epitaxial layer 14, adjacent to the device isolation layer 50, and is insulated from the word line WL 26. The device isolation layer 50 is formed on the word line WL 26 so that the resistance change layer R 54 does not contact the word line WL 26. Accordingly, a leakage current flowing through memory cells M through the word line WL 26 may be reduced.

A plurality of bit lines BL 56 extend on the device isolation layer 50 and on the resistance change layer R 54 in the second direction perpendicular to the word lines WL 26 and are separated from each other along the first direction. As a voltage or a current is applied to the resistance change layer R 54 at a side of the memory cell M through the bit line BL 56, the resistance change layer R 54 is changed to a low resistance or high resistance state. Accordingly, the memory cell M is programmed or erased by adjusting a current flow in a direction perpendicular to an upper surface of the semiconductor substrate 10 from the bit line BL 56, for example, in the bolded arrow direction of FIG. 6 (e.g., in the Z-direction).

EXAMPLE 3

Figure 10:
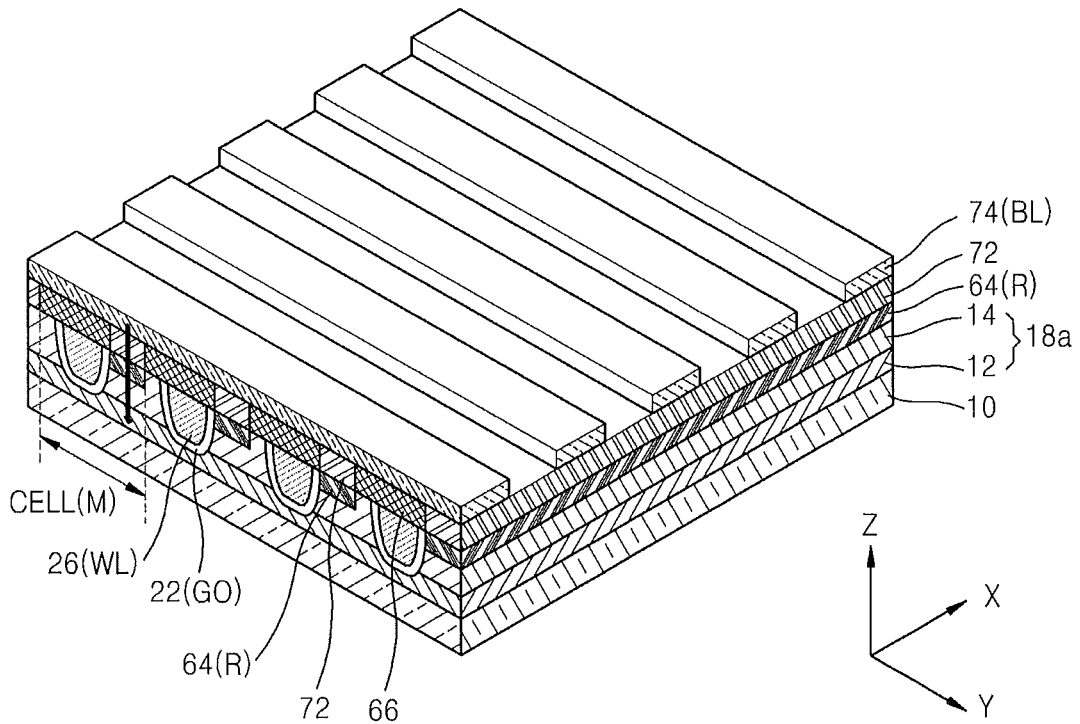
FIGS. 10 and 11 are perspective views illustrating a resistive memory device according to still further embodiments of the inventive concept.
Figure 11:
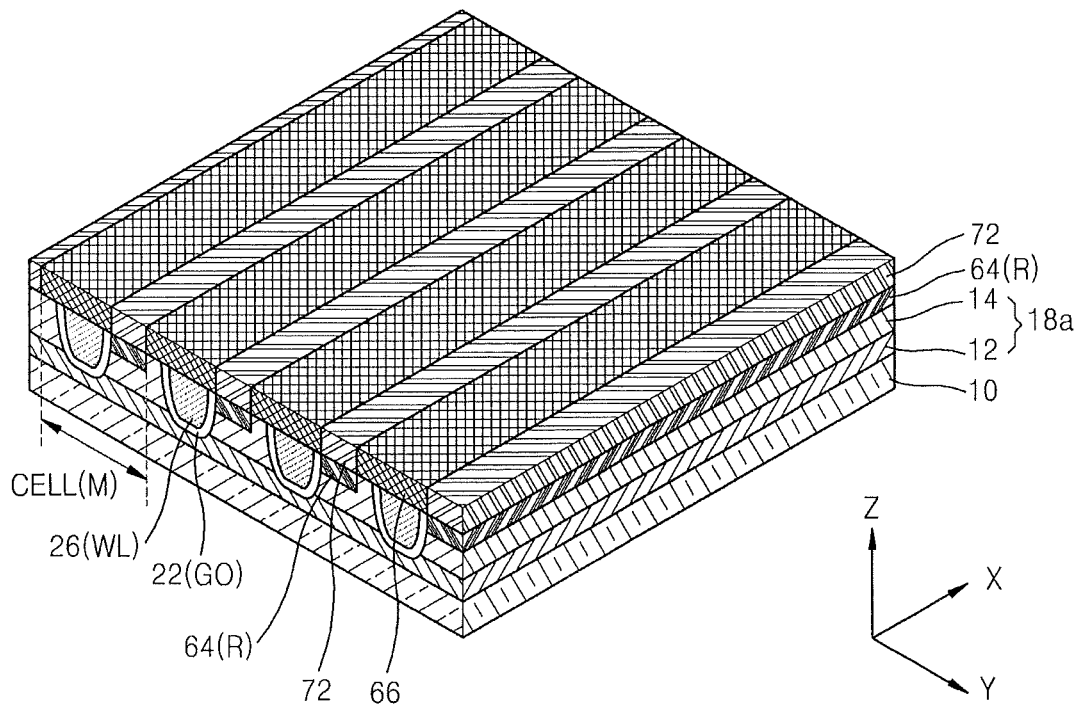
Figure 12:
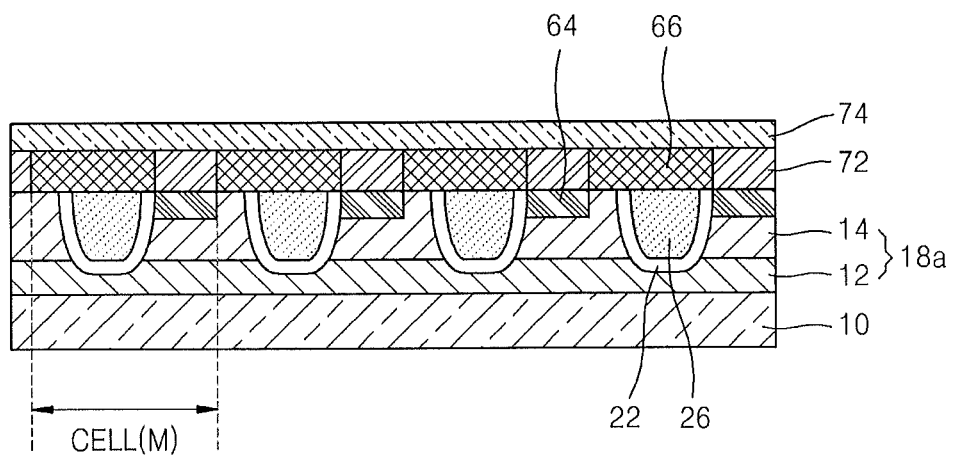
FIGS. 12 and 13 are cross-sectional views illustrating the resistive memory device of FIG. 10.
Figure 13:
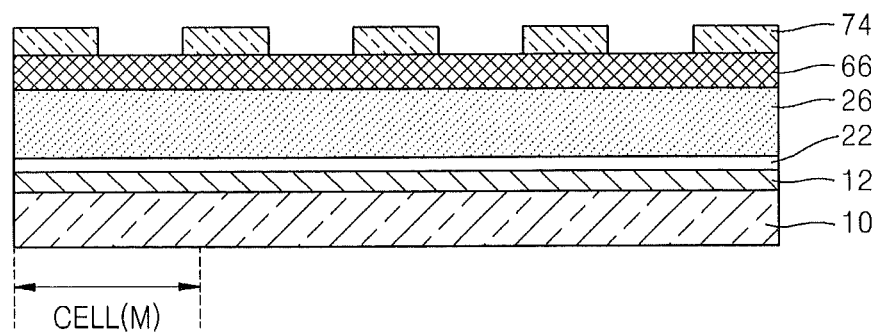

FIGS. 10 and 11 are perspective views illustrating a resistive memory device according to still further embodiments of the inventive concept. FIGS. 12 and 13 are cross-sectional views illustrating the resistive memory device of FIG. 10. Referring to FIG. 11, a bit line BL 74 illustrated in FIG. 10 is omitted for convenience.

In detail, the resistive memory device according to still further embodiments is similar to that of Example 2 except that a resistance change layer R 64 is formed in a portion of a single crystalline silicon layer 18 adjacent to a gate insulation layer GO 22, a connection electrode 72 is further formed on the resistance change layer 64, and a bit line BL 76 is formed on the connection electrode 72.

A plurality of word lines WL 26 are formed on the semiconductor substrate 10 to extend in a first direction, for example, in an X-direction. The word lines WL 26 are electrically separated from each other via a device isolation layer 66 in a second direction perpendicular to the first direction, that is, in the Y-direction. A gate insulation layer GO 22 is formed to extend in the first direction on a side portion of the word lines WL 26. The gate insulation layer 22 may be formed of an oxide layer.

A single crystalline silicon layer 18a constituting a channel layer is formed adjacent to the gate insulation layer 22 and is stacked in a third direction perpendicular to an upper surface of the semiconductor substrate 10, that is, in a Z-direction. The single crystalline silicon layer 18a includes an n-type epitaxial layer 12 and a p-type epitaxial layer 14. The p-type epitaxial layer 14 is an uppermost single crystalline silicon layer of the single crystalline silicon layer 18. When the single crystalline silicon layer 18a is formed as the channel layer, distribution of device parameters such as a set voltage, a reset voltage, a set current, a reset current, etc. may be reduced compared to when a polysilicon layer is formed as the channel layer.

In the resistive memory device according to the current embodiment, the word line WL 26, the gate insulation layer 22, and the single crystalline silicon layer 18a constitute one vertical transistor TR. A plurality of such vertical transistors TR are arranged in the first and second directions, thereby forming a vertical transistor array.

In the resistive memory device according to the embodiments of FIGS. 10-13, a resistance change layer 64 is formed in the single crystalline silicon layer 18a, for example, in a portion of the p-type epitaxial layer 14, which is formed on a side portion of the word line WL 26 and the gate insulation layer 22. Also, a device isolation layer 66 is formed on the word line WL 26 and the gate insulation layer 22 and on a portion of the single crystalline silicon layer 18a. The device isolation layer 66 is formed on the word line WL 26 so that the resistance change layer 64 does not contact the word line WL 26. Accordingly, a leakage current flow between memory cells M through the word line WL 26 may be reduced.

The connection electrode 72 is formed on the resistance change layer 64. A plurality of bit lines BL 74 are formed on the connection electrode 72 and on the device isolation layer 66 to extend in a second direction perpendicular to the word lines WL 26 and are separated from each other along the first direction. A voltage or a current is applied to the resistance change layer 64 on a side portion of the memory cell M through the bit lines BL 74 to convert the resistance change layer 64 to a low resistance or high resistance state. Accordingly, the memory cells M may be programmed or erased by adjusting a current flow from the bit lines BL 74 in a direction perpendicular to an upper surface of the semiconductor substrate 10, for example, in a bolded arrow direction indicated in FIG. 10 (e.g., in the Z-direction).

EXAMPLE 4

Figure 14:
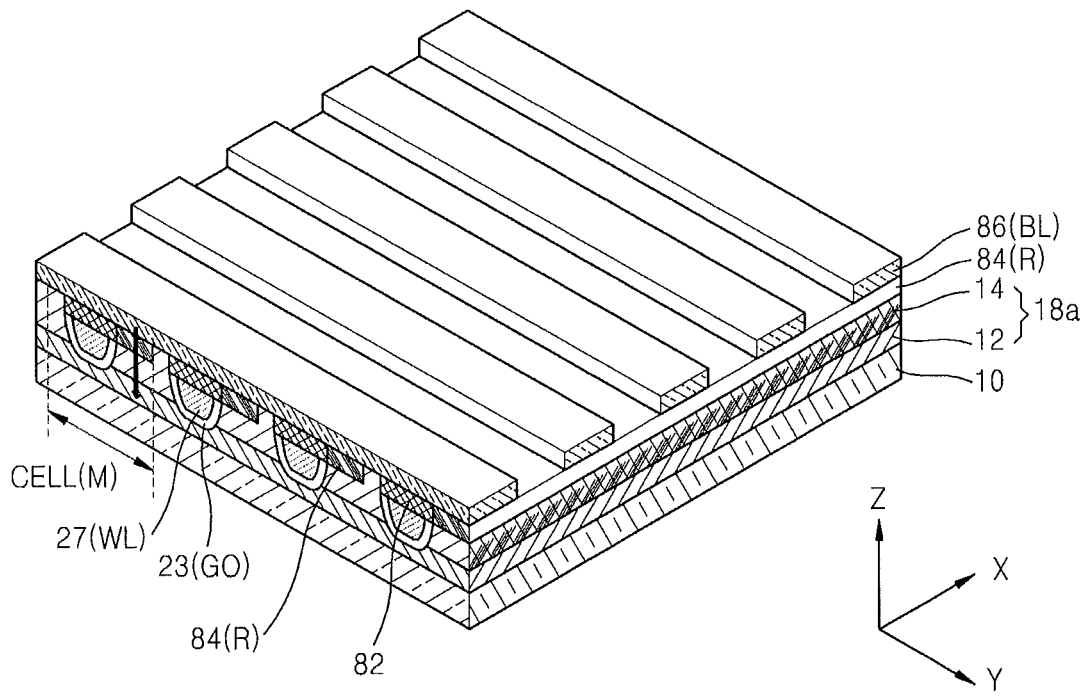
FIGS. 14 and 15 are perspective views illustrating a resistive memory device according to yet further embodiments of the inventive concept.
Figure 15:
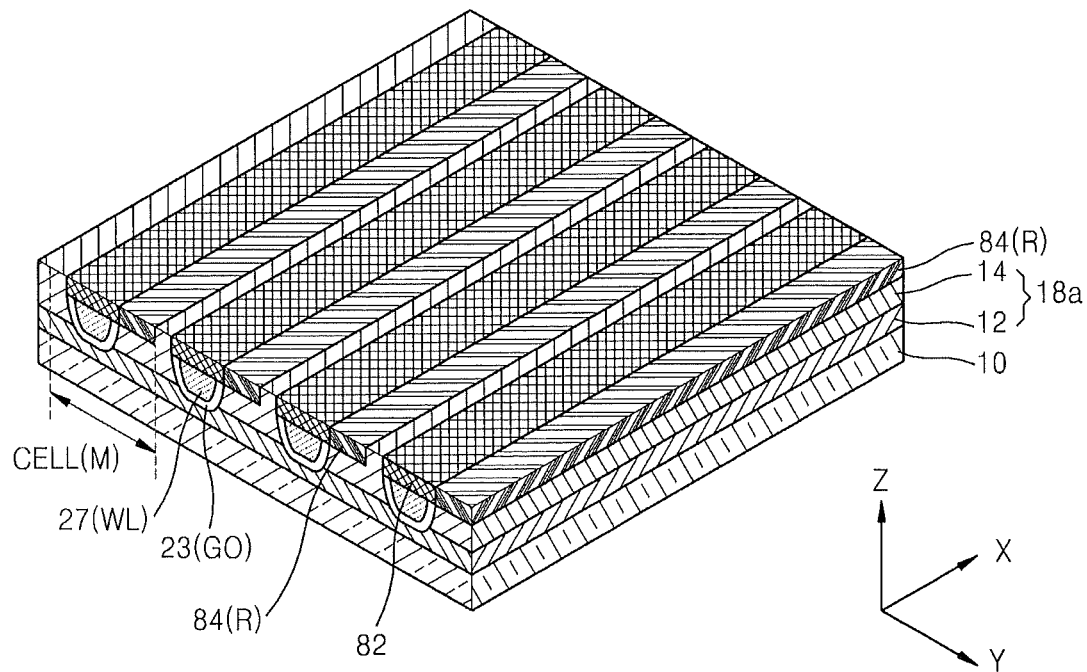
Figure 16:
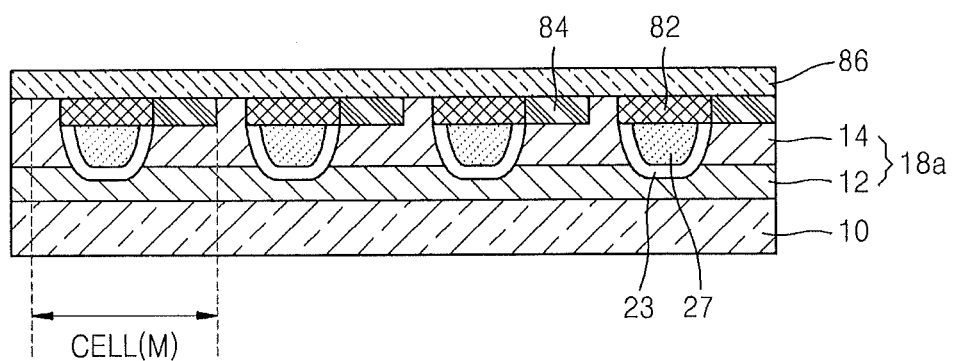
FIGS. 16 and 17 are cross-sectional views illustrating the resistive memory device of FIG. 14.
Figure 17:
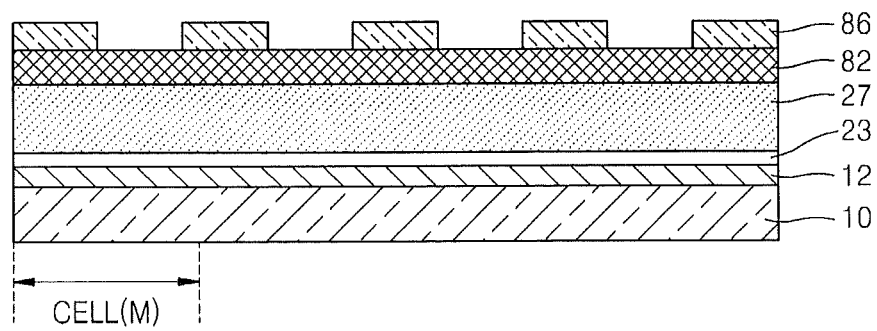

FIGS. 14 and 15 are perspective views illustrating a resistive memory device according to yet further embodiments of the inventive concept. FIGS. 16 and 17 are cross-sectional views illustrating the resistive memory device of FIG. 14.

Referring to FIG. 15, a bit line BL 86 illustrated in FIG. 14 is not illustrated for convenience.

In detail, the resistive memory device according to the embodiments of FIGS. 14-17 is similar to that of Example 2 except that a device isolation layer 82 is formed on a recessed word line WL 27 and a recessed gate insulation layer GO 23, and a resistance change layer R 84 is formed in a portion of a single crystalline silicon layer 18a adjacent to the recessed gate insulation layer 23.

In detail, a plurality of word lines WL 27 are formed on the semiconductor substrate 10 to extend in a first direction, for example, in an X direction. The word lines WL 27 are electrically separated from each other via the device isolation layer 82 along a second direction perpendicular to the first direction, that is, in the Y-direction. A gate insulation layer GO 23 is formed on a side portion of the word lines WL 27 and extends in the first direction. The gate insulation layer 23 may be formed of an oxide layer.

The single crystalline silicon layer 18a constituting a channel layer is formed adjacent to the gate insulation layer 23 and is stacked in a third direction perpendicular to an upper surface of the semiconductor substrate 10, that is, in a Z-direction. The single crystalline silicon layers 18a include an n-type epitaxial layer 12 and a p-type epitaxial layer 14. The p-type epitaxial layer 14 is an uppermost single crystalline silicon layer of the single crystalline silicon layers 18. When the single crystalline silicon layer 18a is formed as the channel layer, distribution of device parameters such as a set voltage, a reset voltage, a set current, a reset current, etc. may be reduced compared to when a polysilicon layer is formed as the channel layer.

In the resistive memory device according to the current embodiment, the word line WL 27, the gate insulation layer 23, and the single crystalline silicon layer 18a constitute one vertical transistor TR. A plurality of such vertical transistors TR are arranged in the first and second directions, thereby forming a vertical transistor array.

The resistive memory device according to the embodiments of FIGS. 14-17 includes the word lines WL 27 and the gate insulation layer 23 which are recessed to be substantially planar with or lower than a surface of the single crystalline silicon layer 18a, and the device isolation layer 82 is formed on the word line WL 27 and the gate insulation layer 23. The resistance change layer R 84 is formed in a portion of the single crystalline silicon layer 18a that is formed adjacent to a side portion of the gate insulation layer 23 and the word line WL 27 that are recessed, and extends in the first direction, that is, in the X-direction. The device isolation layer 82 is formed on the recessed word line WL 27 so that the resistance change layer R 84 does not contact the word line WL 27. In particular, the isolation layer 82 is formed on the word line WL 27 and the gate insulation layer 23 that are recessed and adjacent to the resistance change layer R 84 formed in the p-type epitaxial layer 14. Accordingly, a leakage current flow between the memory cells M through the word lines WL 27 may be reduced.

A plurality of bit lines BL 86 formed on the resistance change layer R 84 and on the device isolation layer 82 extend in the second direction perpendicular to the word lines WL 27 and are separated from each other along in the first direction. A voltage or a current is applied to the resistance change layer R 84 formed on a side portion of the memory cells M through the bit lines BL 86 to convert the resistance change layer R 84 to a low resistance or high resistance state. Accordingly, the memory cell M may be programmed or erased by adjusting a current flow from the bit lines BL 86 in a vertical direction to the semiconductor substrate 14, for example, in a bolded arrow direction indicated in FIG. 14 (e.g. in the Z-direction).

Figure 18:
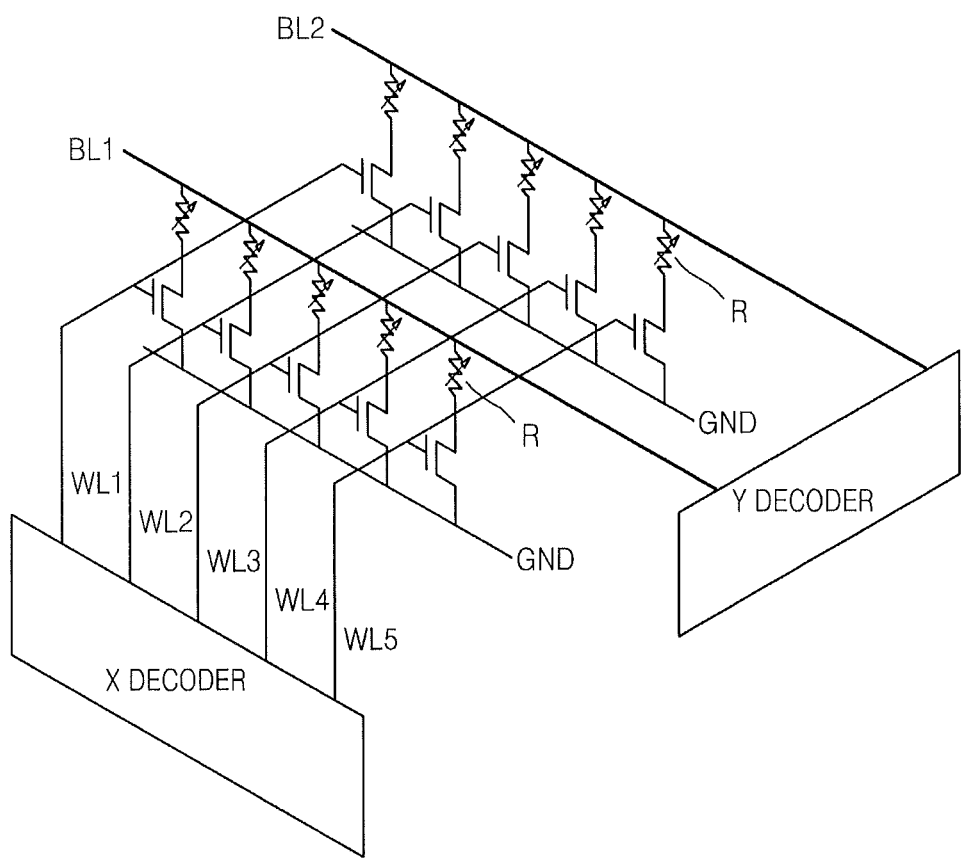
FIG. 18 is a circuit diagram illustrating methods of operating a resistive memory device according to some embodiments of the inventive concept.

FIG. 18 is a circuit diagram for describing methods of operating resistive memory devices according to some embodiments of the inventive concept.

In detail, the resistive memory device according to the embodiments of the inventive concept uses resistance change characteristics of the variable resistor R according to the voltage applied to the memory cells M through the bit lines BL. A programming voltage, that is, a set voltage, is supplied through a bit line BL, for example, BL1, which is selected when programming the memory cell M, so that a resistance of the variable resistor (R) is in the low resistance state. In particular, when the transistor TR is turned on by supplying voltage to a word line WL, for example, WL, a current path is formed in a direction from the bit line BL to the ground GND, thereby programming the memory cell M.

By applying a reset current (erase current) or a reset voltage (erase voltage) to the variable resistor R through a selected bit line BL, for example, BL1, the resistance of the variable resistor R is changed from a low resistance to a high resistance state and no current path is created, thereby erasing the contents of the memory cell M. Also, whether the memory cell M is programmed or erased may be determined by applying a read current or a read voltage to the variable resistor R through the selected bit line BL and reading the current through the bit line BL.

Methods of Manufacturing Resistive Memory Devices According to Some Embodiments of the Inventive Concept FIGS. 19 through 26 are cross-sectional views illustrating methods of manufacturing the resistive memory device of FIG. 4.

Figure 19:
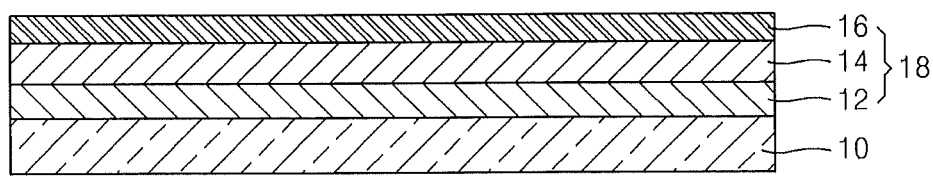
FIGS. 19 through 26 are cross-sectional views illustrating methods of manufacturing the resistive memory device of FIG. 4.

Referring to FIG. 19, a single crystalline silicon layer 18 is formed on a semiconductor substrate 10, for example, a silicon substrate. The single crystalline silicon layer 18, which constitutes a channel layer, may include a plurality of single crystalline silicon layers 12, 14, and 16 having different conductivities. The single crystalline silicon layers 12, 14, and 16 constituting the single crystalline silicon layer 18 are stacked in a direction perpendicular to upper surface of the semiconductor substrate 10.

In detail, an n-type epitaxial layer 12 is formed on the semiconductor substrate 10, a p-type epitaxial layer 14 is formed on the n-type epitaxial layer 12, and an n-type epitaxial layer 16 is formed on the p-type epitaxial layer 14. In some alternative embodiments, the n-type epitaxial layer 16 may be omitted.

Figure 20:
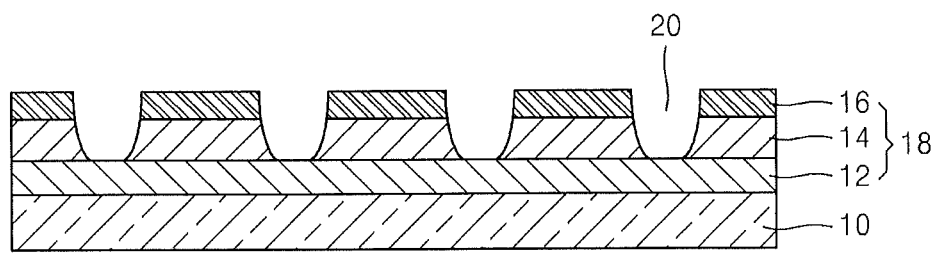
Figure 21:
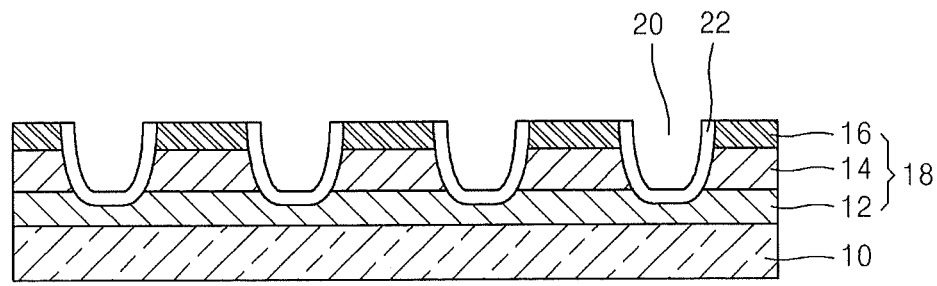

Referring to FIGS. 20 and 21, a portion of the single crystalline silicon layer 18 is etched in a direction perpendicular to an upper surface of the semiconductor substrate 10 to form a plurality of grooves 20 that are separated from one another. Bottom surfaces of the grooves 20 may be disposed on an uppermost surface of the n-type epitaxial layer 12 in consideration of forming a gate insulation material layer therein. Next, a gate insulation material layer 22 is formed in the grooves 20. The gate insulation material layer 22 may be formed of an oxide layer. Through an oxidization process for forming the gate insulation material layer 22 using an oxide layer, the bottom surfaces of the grooves 20 are disposed within the n-type epitaxial layer 12. That is, portions of the uppermost surface of the n-type epitaxial layer 12 may be consumed in the oxidation process.

Figure 22:
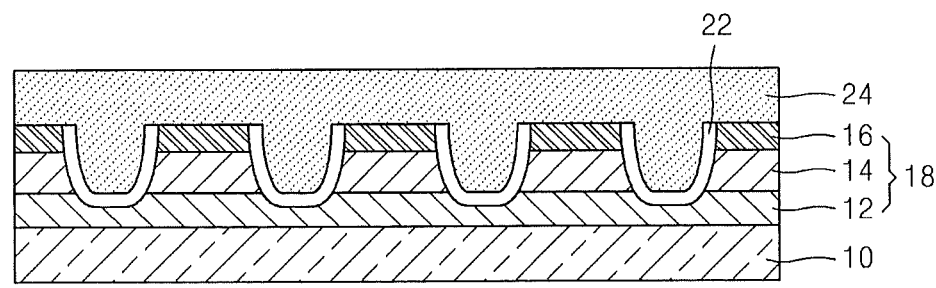
Figure 23:
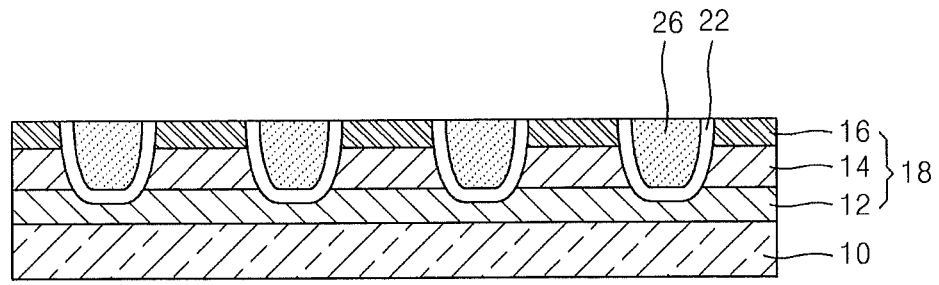

Referring to FIGS. 22 and 23, a gate electrode material layer 24 is formed on the n-type epitaxial layer 16 and to fill the grooves 20 including the gate insulation material layer 22. The gate electrode material layer 24 may be formed of a polysilicon layer. Next, the gate electrode material layer 24 is etched, thereby forming a gate electrode 26 that is filled in the grooves 20. The gate electrode material layer 24 may be etched using a chemical mechanical polishing (CMP) process. When using the CMP process, an etching stopping point may be an upper surface of the n-type epitaxial layer 16.

Figure 24:
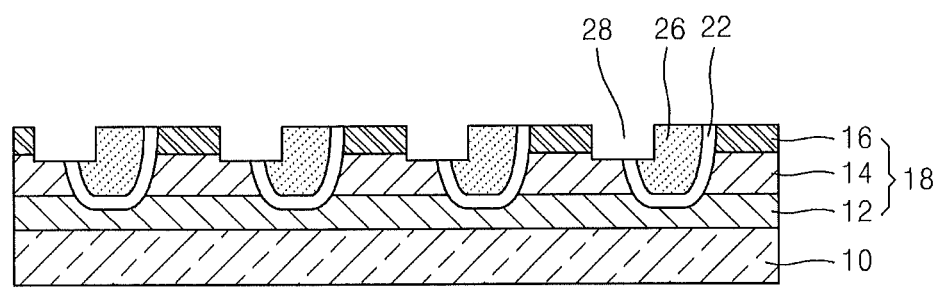
Figure 25:
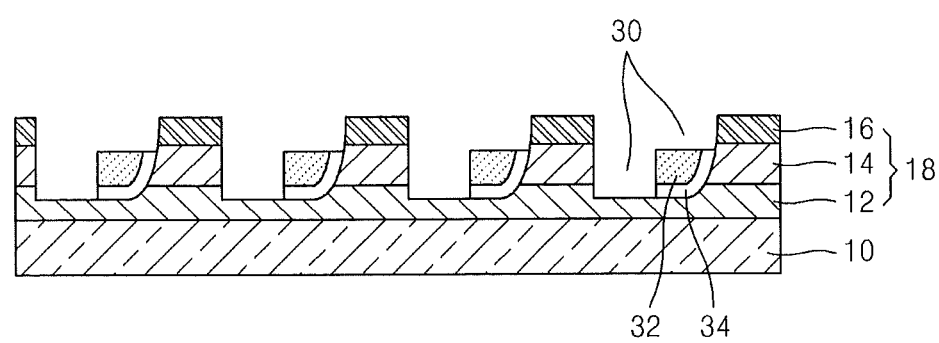

Referring to FIGS. 24 and 25, a first trench 28 is formed by etching a portion of the gate electrode material layer 26, a portion of the gate insulation material layer 22, and potions of the n-type epitaxial layer 16 and the p-type epitaxial layer 14 of the single crystalline silicon layer 18 between the grooves 20, for example, using a first etching mask.

Next, a second trench 30 is formed by etching from a lower portion of the first trench 28 to a middle portion of the n-type epitaxial layer 12 and etching the gate electrode material layer 26 and the gate insulation material layer 22 formed in the grooves 20 adjacent to the first trench 28, for example, using a second etching mask. Accordingly, a second trench 30 is formed in a lower portion in the grooves 20 and over the gate electrode 32 and the gate insulation layer 34. That is, a second trench 30 is formed in the grooves 20 above the gate electrode 32 and the gate insulation layer 34 and in portions of the single crystalline silicon layers 18 adjacent the grooves 20. Also, a gate insulating layer 34 is formed in a lower side portion of the grooves 20, and a gate electrode 32 is formed on the gate insulation layer 34.

Figure 26:
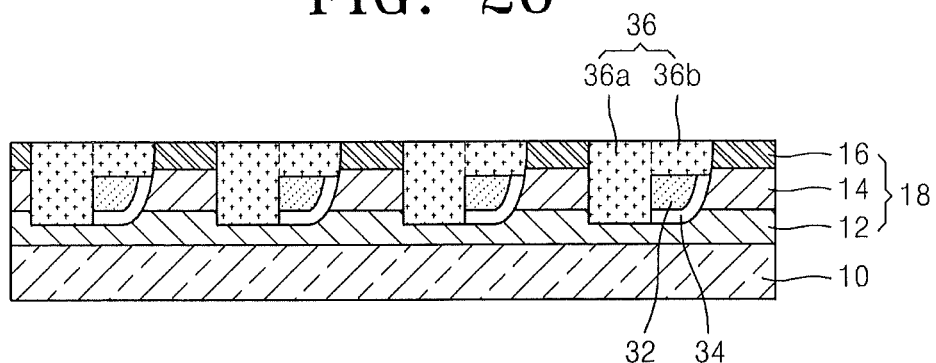

Referring to FIG. 26, a device isolation layer 36 that fills the first trench 28 and the second trench 30 is formed. The device isolation layer 36 is formed by filling the first trench 28 and the second trench 30 with an insulation layer such as an oxide layer and polishing the insulation layer by using the n-type epitaxial layer 16 as an etching stopping point. The device isolation layer 36 includes a first portion 36a that faces the single crystalline silicon layer 18 and is adjacent to the gate electrode 32, and a second portion 36b that contacts the first device isolation layer 36a in the grooves 20 and is formed on the gate electrode 32 and the gate insulation layer 34.

The device isolation layer 36 includes the first portion of the device isolation layer 36a formed in the first and second trenches 28 and 30 that are formed by etching the single crystalline silicon layer 18 and the word lines WL 32 and the second portion of the device isolation layer 36b that is formed on the word lines WL 32 and the gate insulation layer 34 in the grooves 20 formed by etching the single crystalline silicon layer 18. Reference numeral 32 is used to denote both the word lines WL and gate electrode.

In addition, as illustrated in FIGS. 4 and 5, a resistance change layer R 38 is formed on the device isolation layer 36 and the p-type epitaxial layer 14 of the single crystalline silicon layer 18. The resistance change layer R 38 may be formed using the transition metal oxide or the ternary oxide material described above. Next, the bit line BL 40 is formed on the resistance change layer R 38, thereby completing the manufacture of the resistive memory device according to some embodiments.

Figure 27:
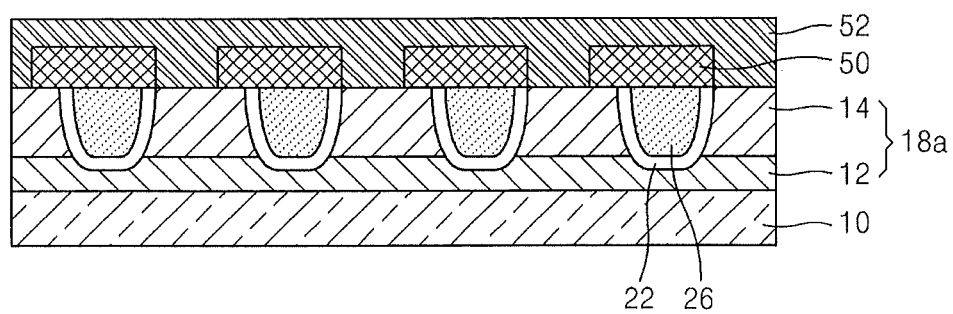
FIGS. 27 and 28 are cross-sectional views illustrating methods of manufacturing the resistive memory device of FIG. 8.
Figure 28:
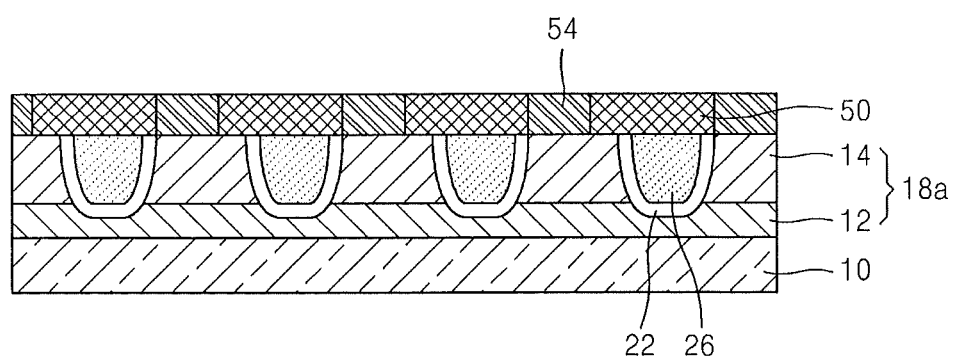

FIGS. 27 and 28 are cross-sectional views illustrating methods of manufacturing the resistive memory device of FIG. 8.

In detail, the operations shown in FIGS. 21 through 23 are performed, but using a single crystalline silicon layer 18a including two layers (instead of three layers) respectively formed of materials with different conductivities. That is, the single crystalline silicon layer 18a is formed by sequentially forming the n-type epitaxial layer 12 and the p-type epitaxial layer 14 on the semiconductor substrate 10.

Referring to FIG. 27, the device isolation layer 50 is formed on the gate electrode 26 and the gate insulation layer 22 in the grooves 20 and on a portion of the p-type epitaxial layer 14. The device isolation layer 50 may be formed of an oxide layer. The device isolation layer 50 exposes portions of the p-type epitaxial layer 14. By filling the exposed portions of the p-type epitaxial layer 14, a resistance change material layer 52 is formed on the device isolation layer 50. That is, the resistance change material layer 52 is formed on the exposed portions of the p-type epitaxial layer 14 and on the device isolation layer 50.

Referring to FIG. 28, the resistance change layer R 54 is formed by polishing the resistance change material layer 52. The resistance change layer R 54 may be formed of the transition metal oxide or the ternary oxide material described above. The resistance change layer R 54 is polished to be substantially planar with a surface of the device isolation layer 50. Next, as illustrated in FIG. 8, the bit line 56 is formed on the device isolation layer 50 and the resistance change layer R 54 to complete the resistive memory device according to further embodiments.

FIGS. 29 through 34 are cross-sectional views illustrating methods of manufacturing the resistive memory device of FIG. 12.

In detail, the operations of the method of manufacturing a resistive memory device described with reference to FIGS. 21 through 23 are performed, but a single crystalline silicon layer 18a including two layers (rather than three layers) with different conductivities is formed on the semiconductor substrate 10. That is, the single crystalline silicon layer 18a is formed by sequentially forming an n-type epitaxial layer 12 and a p-type epitaxial layer 14 on the semiconductor substrate 10.

Figure 29:
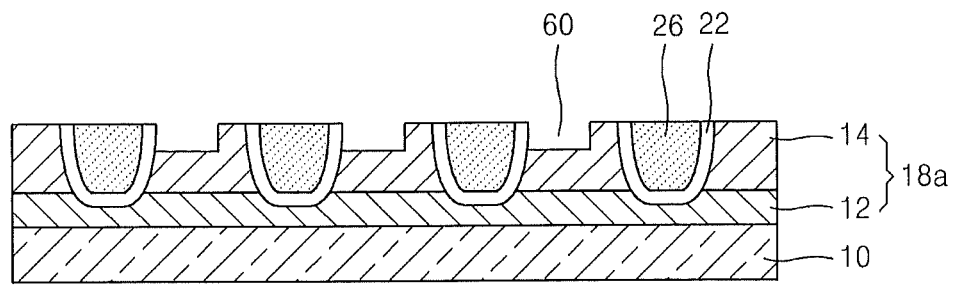
FIGS. 29 through 34 are cross-sectional views illustrating methods of manufacturing the resistive memory device of FIG. 12.
Figure 30:
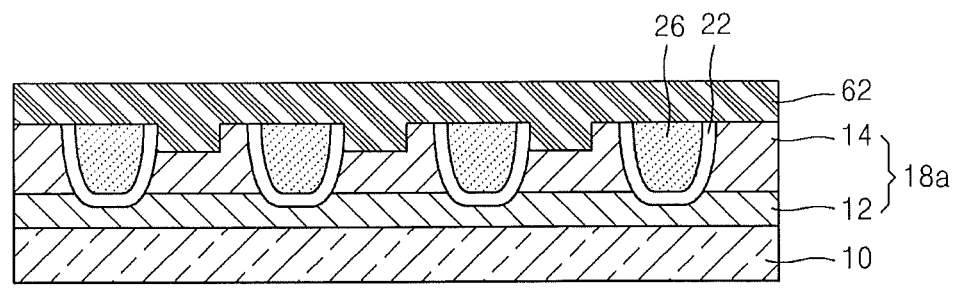
Figure 31:
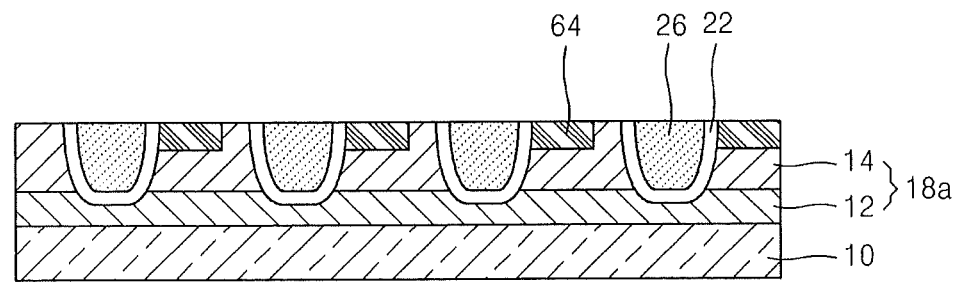
Figure 32:
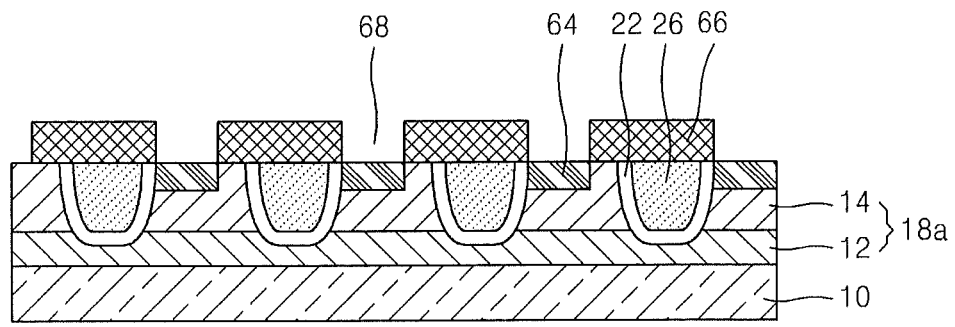

Referring to FIGS. 29 and 30, a recess 60 is formed at a side of the gate electrode 26 by etching the portion of the single crystalline silicon layer 18a adjacent to the gate insulation layer 22. Next, a resistance change material layer 62 is formed on the single crystalline silicon layer 18a by filling the recess 60. Referring to FIGS. 31 and 32, the resistance change material layer 62 is polished to form the resistance change layer 64 in a portion of the single crystalline silicon layer 18a adjacent to the gate electrode 26 and the gate insulation layer 22. The resistance change layer 64 may be formed of the transition metal oxide or the ternary oxide material described above. When polishing the resistance change layer 64, an upper surface of the single crystalline silicon layer 18a is used as a polishing stopping point. Next, the device isolation layer 66 having a recess 68 that exposes the resistance change layer 64 is formed on the gate insulation layer 22, the gate electrode 26, and the single crystalline silicon layer 18a.

Figure 33:
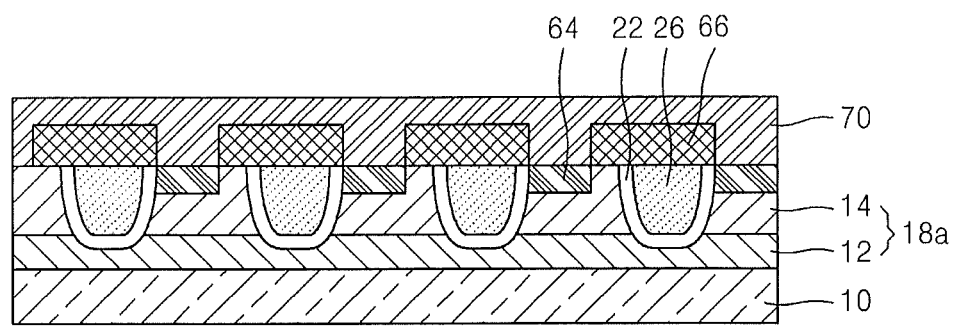
Figure 34:
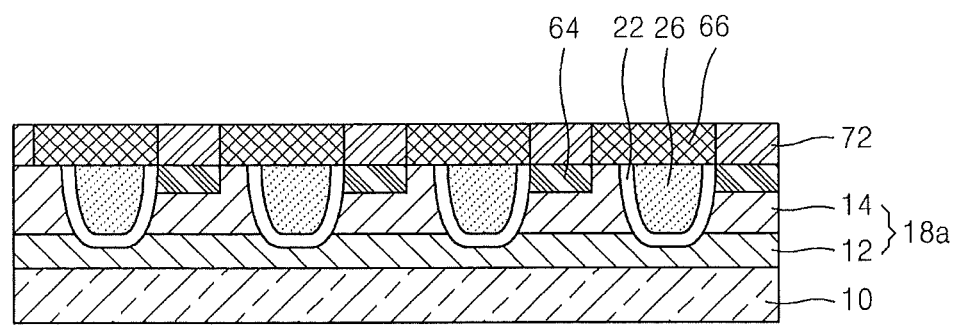

Referring to FIGS. 33 and 34, a connection electrode material layer 70 is formed on the device isolation layer 66 by filling the recess 68. Next, the connection electrode 72 is formed by polishing the connection electrode material layer 70. When polishing the connection electrode material layer 70, the device isolation layer 66 is used as a polishing stopping layer. The connection electrode 72 is formed adjacent to the device isolation layer 66. Next, as illustrated in FIG. 12, the bit line BL 74 is formed on the device isolation layer 66 and the connection electrode 72, thereby completing the manufacture of the resistive memory device according to still further embodiments.

Figure 35:
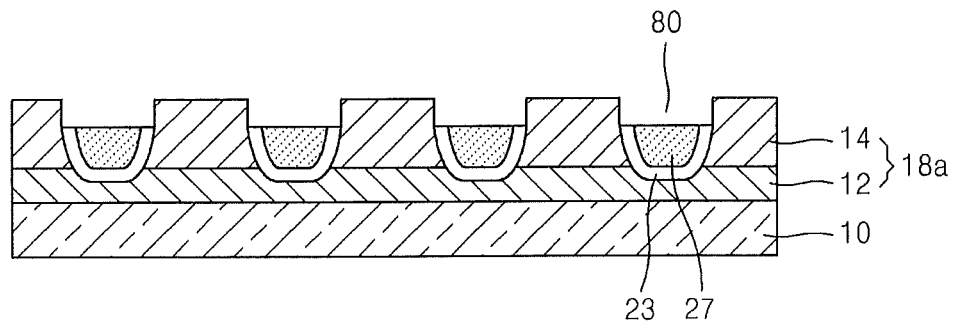
FIGS. 35 through 37 are cross-sectional views illustrating methods of manufacturing the resistive memory device of FIG. 16.
Figure 36:
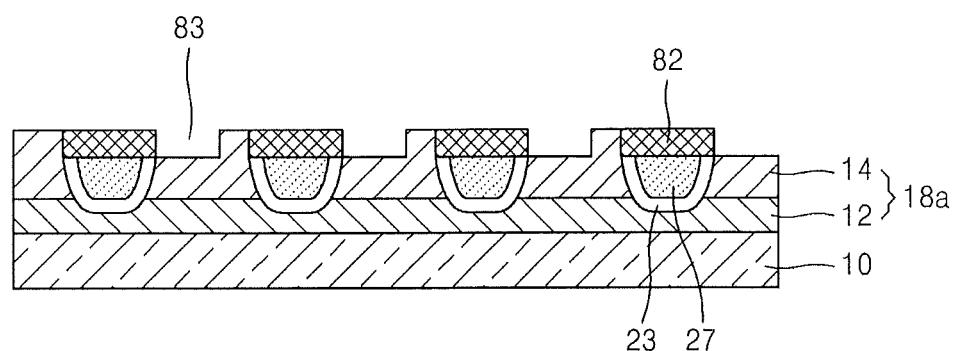
Figure 37:
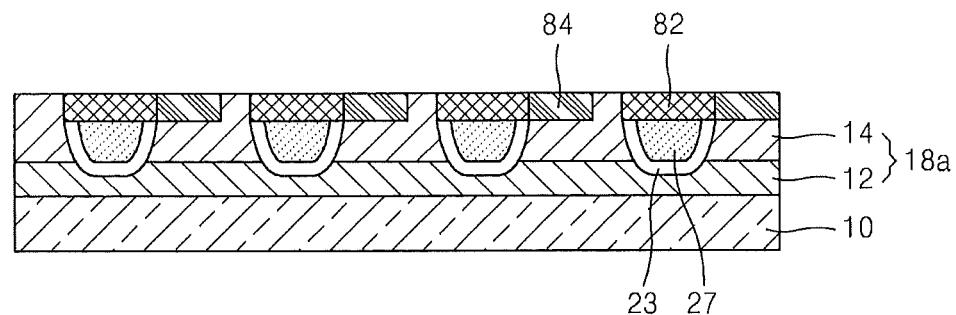

FIGS. 35 through 37 are cross-sectional views illustrating methods of manufacturing the resistive memory device of FIG. 16.

In detail, the operations of the method of manufacturing a resistive memory device described with reference to FIGS. 21 through 23 are performed, but as shown in FIG. 35, a single crystalline silicon layer 18a including two layers (rather than three layers) with different conductivities is formed on the semiconductor substrate 10. That is, the single crystalline silicon layer 18a is formed by sequentially forming an n-type epitaxial layer 12 and a p-type epitaxial layer 14 on the semiconductor substrate 10.

Referring to FIG. 35, a first recess 80 is formed by etching a gate insulation material layer 22 and a gate electrode material layer 26. Accordingly, the gate insulation layer 23 and the gate electrode 27 that are recessed in a groove on the semiconductor substrate 10 are formed. That is, the gate insulation layer 23 and the gate electrode 27 are recessed to have a lower height than an upper surface of the single crystalline silicon layer 18a.

Referring to FIG. 36, the device isolation layer 82 is formed to fill the first recess 80. In this regard, the device isolation layer 82 is formed by forming a device isolation material layer on the single crystalline silicon layer 18a, the gate insulation layer 23, and the gate electrode 27 to fill the first recess 80, and then chemically-mechanically polishing the device isolation material layer. Next, a portion of the single crystalline silicon layer 18a (in particular, a portion of p-type epitaxial layer 14) adjacent to the gate insulation layer 23 and the device isolation layer 82 is etched, thereby forming a second recess 83 at a side of the gate electrode 27.

Referring to FIG. 37, the resistance change layer R 84 is formed in the single crystalline silicon layer 18a by filling the second recess 83. In particular, the resistance change layer R 84 is formed by forming a resistance change material layer (not shown) on the single crystalline silicon layer 18a to fill the second recess 83, and chemically mechanically polishing the resistance change material layer. The resistance change layer R 84 may be formed of the transition metal oxide or the ternary oxide material described above. Next, as illustrated in FIG. 16, the bit line BL 86 is formed on the device isolation layer 82, the resistance change layer R 84, and the single crystalline silicon layer 18a, thereby completing the manufacture of the resistive memory device according to yet further embodiments.

Figure 38:
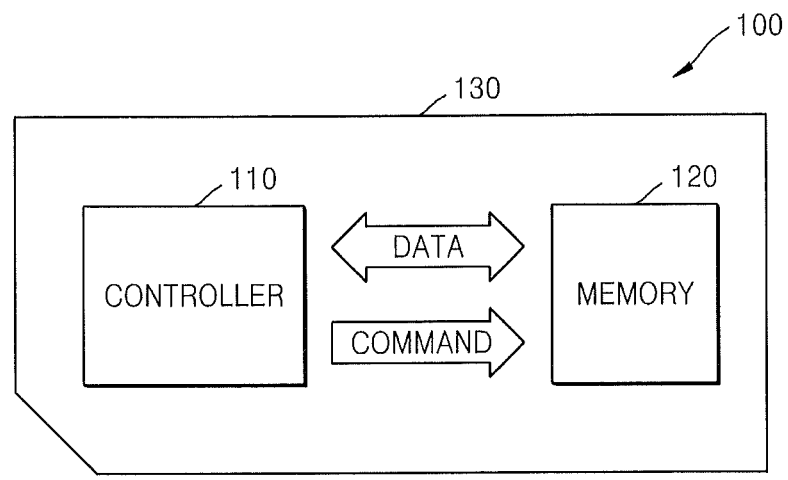
FIG. 38 is a schematic view illustrating a memory card according to some embodiments of the inventive concept.

Example Applications of Resistive Memory Devices According to Embodiments of the Inventive Concept FIG. 38 is a schematic view illustrating a memory card 100 according to some embodiments of the inventive concept.

Referring to FIG. 38, the memory card 100 may include a controller 110 and a memory 120 mounted in a housing 130. The controller 110 and the memory 120 may exchange electrical signals. For example, the memory 120 and the controller 110 may transmit and receive data to/from each other according to commands from the controller 110. Accordingly, the memory card 100 may store data in the memory 120 or output data from the memory 120 to the outside (e.g., to external devices).

The memory 120 may include at least one of the resistive memory devices illustrated in FIG. 2, FIG. 6, FIG. 10, and FIG. 14. The memory card 100 may be used as a data storage medium of various portable devices. For example, the memory card 100 may be a memory stick card, a smart media (SM) card, a secure digital (SD) card, a mini secure digital (SD) card, and/or a multimedia card (MMC).

Figure 39:
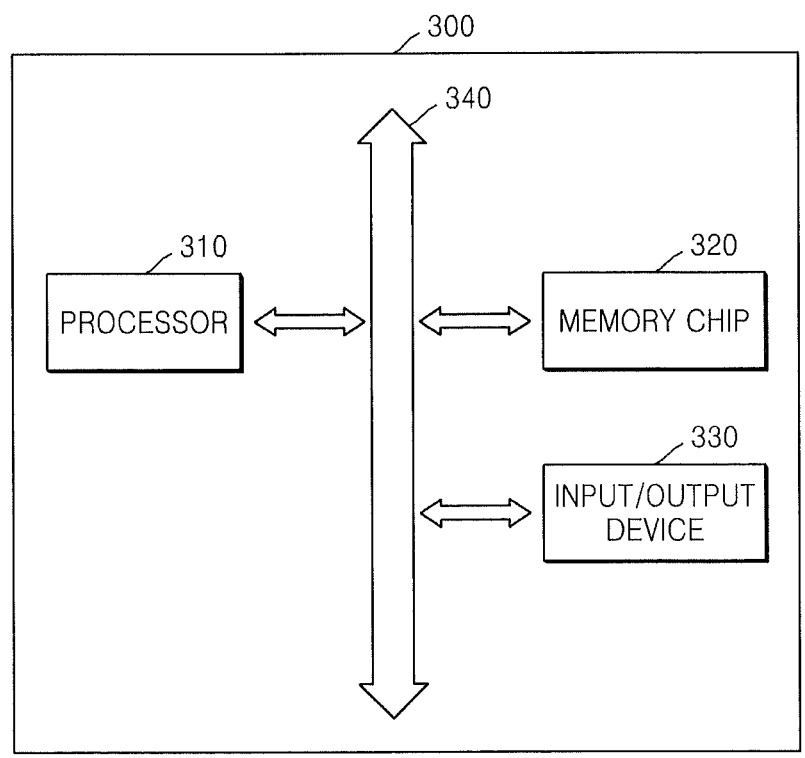
FIG. 39 is a block diagram illustrating an electronic system according to some embodiments of the inventive concept.

FIG. 39 is a block diagram illustrating an electronic system 300 according to some embodiments of the inventive concept.

Referring to FIG. 39, the electronic system 300 may include a processor 310, an input/output device 330, and a memory chip 320, and these units may communicate data with one another via a bus 340. The processor 310 may execute programs and control the electronic system 300. The input/output device 330 may input or output data of the electronic system 300. The electronic system 300 may be connected to an external device, for example, a personal computer or a network, by using the input/output device 330, to exchange data with the external device. The memory chip 320 may store codes or data for operating the processor 310. For example, the memory chip 320 may include one of the resistive memory devices illustrated in FIG. 2, FIG. 6, FIG. 10, and FIG. 14.

The electronic system 300 may be included in various electronic control devices that require the memory chip 320, and may be used in, for example, mobile phones, MP3 players, navigation apparatuses, solid state disks (SSDs), and/or household appliances.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

While the inventive concept has been particularly shown and described with reference to exemplary embodiments thereof, it will be understood that various changes in form and details may be made therein without departing from the spirit and scope of the following claims.

That which is claimed:

1. A resistive memory device including a memory cell, the memory cell comprising:
   a vertical transistor comprising a gate electrode on a surface of a substrate, a gate insulation layer extending along a sidewall of the gate electrode, and a single crystalline silicon layer on the surface of the substrate adjacent to the gate insulation layer, at least a portion of the single crystalline silicon layer defining a channel region that extends in a direction substantially perpendicular to the surface of the substrate; and
   a variable resistance layer on the single crystalline silicon layer and electrically insulated from the gate electrode.

2. The resistive memory device of claim 1, wherein the single crystalline silicon layer comprises a plurality of epitaxial layers of alternating conductivity types.

3. The resistive memory device of claim 1, wherein the plurality of epitaxial layers comprise an n-type epitaxial layer, a p-type epitaxial layer, and an n-type epitaxial layer that are sequentially stacked on the substrate, or an n-type epitaxial layer and a p-type epitaxial layer that are sequentially stacked on the substrate.

4. The resistive memory device of claim 1, further comprising a bit line on the variable resistance layer, wherein the variable resistance layer is electrically coupled between the bit line and a source/drain region of the vertical transistor in the single crystalline silicon layer.

5. The resistive memory device of claim 4, further comprising:
   a device isolation layer including a first portion on the surface of the substrate and extending along a sidewall of the gate electrode opposite the gate insulation layer, and a second portion on the gate electrode and on the gate insulation layer, wherein the first portion extends between the gate electrode and an adjacent resistive memory device on the surface of the substrate, and wherein the second portion extends between the gate electrode and the variable resistance layer.

6. The resistive memory device of claim 4, further comprising:

a device isolation layer on the gate electrode and on the gate insulation layer, wherein the device isolation layer electrically insulates the gate electrode from the bit line.

7. The resistive memory device of claim 6, wherein the device isolation layer further extends onto a portion of the single crystalline silicon layer.

8. The resistive memory device of claim 7, wherein the variable resistance layer extends along a portion of the gate insulation layer and is confined below the device isolation layer.

9. The resistive memory device of claim 8, further comprising:
a connection electrode on the variable resistance layer and extending through the device isolation layer to electrically connect the variable resistance layer to the bit line.

10. The resistive memory device of claim 6, wherein the variable resistance layer is on a portion of the single crystalline silicon layer adjacent to the device isolation layer such that the variable resistance layer and the device isolation layer define a substantially planar surface.

11. A resistive memory device, comprising:
a plurality of word lines extending in a first direction on a surface of a substrate and electrically separated from one another by a device isolation layer in a second direction substantially perpendicular to the first direction;
respective gate insulation layers extending along respective sidewalls of the plurality of word lines in the first direction;
a single crystalline silicon layer adjacent to the gate insulation layers and defining at least one channel region that extends in a third direction substantially perpendicular to the surface of the substrate, wherein the word lines, the gate insulation layers, and the single crystalline silicon layer define a vertical transistor array arranged in the first direction and the second direction;
a device isolation layer extending in the first direction on the plurality of word lines and the gate insulation layers;
a variable resistance layer that is electrically insulated from the plurality of word lines by the device isolation layer and is adjacent to the single crystalline silicon layer at a side of the word lines; and
a plurality of bit lines on the variable resistance layer, wherein the plurality of bit lines extend in the second direction substantially perpendicular to the plurality of word lines and are separated from one another in the first direction.

12. The resistive memory device of claim 11, wherein the variable resistance layer is on the single crystalline silicon layer and extends in the first direction substantially parallel to the word lines, and wherein the variable resistance layer electrically couples ones of the plurality of bit lines to respective source/drain regions in the single crystalline silicon layer.

13. The resistive memory device of claim 11, wherein the plurality of bit lines are directly on the device isolation layer and the variable resistance layer, or wherein the plurality of bit lines are on a connection electrode on the resistance change layer.

14. The resistive memory device of claim 11, wherein the device isolation layer comprises a first portion on the substrate extending along respective sidewalls of the plurality of word lines opposite the gate insulation layers, and a second portion on the plurality of word lines, the gate insulation layer, and the single crystalline silicon layer.

15. The resistive memory device of claim 11, wherein the device isolation layer extends on the plurality word lines, the gate insulation layers, and portions of the single crystalline silicon layer, and wherein the variable resistance layer extends along portions of the respective gate insulation layers and is confined below the device isolation layer.

16. A resistive memory device, comprising:
a single crystalline silicon layer comprising alternating layers of different conductivity types on a substrate;
a plurality of grooves in the single crystalline silicon layer extending in a first direction, wherein ones of the plurality of grooves are separated from one another in a second direction substantially perpendicular to the first direction,
a respective gate insulation layer and a respective word line in each of the plurality of grooves and extending in the first direction, wherein the word lines, the gate insulation layers, and the single crystalline silicon layer define a vertical transistor array arranged in the first direction and the second direction;
a device isolation layer extending in the first direction on the word lines and the gate insulation layers;
a variable resistance layer on portions of the single crystalline silicon layer outside the plurality of grooves; and
a plurality of bit lines on the resistance change layer and electrically connected thereto, wherein the plurality of bit lines extend in a second direction substantially perpendicular to the word lines and are separated from one another in the first direction.

17. The resistive memory device of claim 16, wherein the device isolation layer comprises a first portion in a trench that is formed in each of the plurality of grooves by etching a portion of the single crystalline silicon layer and a portion of the word line therein, and a second portion that is formed on the word lines and the gate insulation layer in each of the plurality of grooves that are formed by etching a portion of the single crystalline silicon layer.

18. The resistive memory device of claim 16, wherein the device isolation layer is on the word lines, on the gate insulation layer, and on portions of the single crystalline silicon layer.

19. The resistive memory device of claim 16, wherein the device isolation layer is adjacent to the variable resistance layer that is formed on single crystalline silicon layer, and is on the word line and the gate insulation layer such that the variable resistance layer and the device isolation layer define a substantially planar surface.

20. The resistive memory device of claim 16, wherein the variable resistance layer extends in the first direction on the single crystalline silicon layer at sides of the word lines and the gate insulation layers, and wherein the variable resistance layer electrically couples ones of the plurality of bit lines to respective source/drain regions in the single crystalline silicon layer.

* * * * *